United States Patent [19]

Werner, Jr. et al.

[11] Patent Number: 5,204,636
[45] Date of Patent: Apr. 20, 1993

[54] DYNAMIC LIMITING CIRCUIT FOR AN AMPLIFIER

[75] Inventors: Alan J. Werner, Jr., Rochester, N.Y.; Mostafa R. Yazdy, Los Angeles, Calif.

[73] Assignee: Xerox Corporation, Stamford, Conn.

[21] Appl. No.: 878,654

[22] Filed: May 5, 1992

[51] Int. Cl.$^5$ ............................................. H03F 3/16
[52] U.S. Cl. ...................................... 330/85; 330/253; 330/259; 330/260
[58] Field of Search ............... 330/85, 110, 298, 207 P, 330/253, 260, 259; 307/501, 494

[56] References Cited

U.S. PATENT DOCUMENTS

| | | | |
|---|---|---|---|
| 3,378,779 | 4/1968 | Priddy | 330/82 |
| 3,586,991 | 6/1971 | Vasteen | 330/207 P |
| 3,947,727 | 3/1976 | Stewart | 330/298 |
| 4,429,282 | 1/1984 | Saari | 330/9 |
| 4,849,850 | 7/1989 | Brahms | 330/298 |
| 4,973,916 | 11/1990 | Baik | 330/264 |
| 5,117,200 | 5/1992 | Scott, III et al. | 330/85 |
| 5,121,080 | 6/1992 | Scott, III et al. | 330/85 |

OTHER PUBLICATIONS

"High Voltage Stabilization Circuit", Xerox Disclosure Journal, Milkie et al., vol. 12, No. 2, pp. 85-86, Mar.-/Apr. 1987.

*Primary Examiner*—Robert J. Pascal
*Assistant Examiner*—Tan Dinh
*Attorney, Agent, or Firm*—Duane C. Basch

[57] ABSTRACT

A dynamically limited amplifier including an operational amplifier having both non-inverting and inverting input terminals, an output terminal, and dynamic limiting circuitry connected between the inverting input and output terminals of the operational amplifier. The dynamically limiting circuitry operates to supply a feedback current between the output terminal of the operational amplifier and the inverting input terminal of the operational amplifier, whenever the output voltage of the operational amplifier exceeds a threshold potential.

13 Claims, 2 Drawing Sheets

DYNAMIC LIMITING CIRCUIT FOR AN AMPLIFIER

This invention relates generally to an improved operational amplifier, and more particularly to dynamic limiting circuitry employing field-effect transistor technology.

CROSS REFERENCE

The following related applications are hereby incorporated by reference for their teachings:

"Electrostatic Voltmeter Employing High Voltage Integrated Circuit Devices," Alan J. Werner, Jr. et al., Ser. No. 07/878,658 (Common Assignee), filed concurrently herewith.

BACKGROUND OF THE INVENTION

The present invention is a limiting circuit for use with an amplifier having high direct-current (DC) stability and high immunity to oscillation, the amplifier being commonly referred to as an operational amplifier or opamp. The opamp is commonly used with negative feedback circuitry to perform analog operations such as summation and integration.

Heretofore, it has been recognized that operational amplifiers require overload protection or limiting circuitry to avoid damage to the opamp and to eliminate abnormal or unpredictable behavior within the circuit which utilizes the opamp when it is driven into saturation. While the opamps are intended to be used over a voltage range where a linear response is found, it may, in certain situations, be desirable or necessary to overdrive them into saturation. Unfortunately, when the opamp is driven into saturation there is no feedback to maintain the input differential at zero volts. Under saturation conditions, the inputs may be driven to "abnormal" potentials, thereby charging up input capacitances, etc., which in turn creates recovery problems when the input signal is reduced, due primarily to hysteretic behavior.

Some of the approaches used to protect or limit operational amplifier feedback circuits are illustrated in the following disclosures which may be relevant:

U.S. Pat. No. 3,586,991
Patentee: Vosteen
Issued: Jun. 22, 1971

U.S. Pat. No. 4,429,282
Patentee: Saari
Issued: Jan. 31, 1984

Publication: Xerox Disclosure Journal
Author: Milkie et al.
Volume 12, No. 2, pp. 85–86
March/April 1987

The relevant portions of the foregoing patents and disclosure may be briefly summarized as follows:

U.S. Pat. No. 3,586,991 to Vosteen discloses an overload protection circuit for an amplifier, where the operating potential of the amplifier is limited to a potential less than the destruction potential of the amplifier. Zener diodes are used in an amplifier protection circuit to prevent the application of voltages capable of damaging the elements of the amplifier.

U.S. Pat. No. 4,429,282 to Saari discloses a high performance operation amplifier circuit which nulls the offset voltage by means of switched capacitors, and holds the output signal during nulling. A pair of non-overlapping pulse trains are used to control the switched capacitor nulling circuit which requires no filtering in the feedback path. Also disclosed is an offset limiting feedback network for clipping the output at a level inside the limits of the amplifier, thereby preventing the locking of the circuit which may result from an excessive initial offset voltage.

The disclosure in the Xerox Disclosure Journal by Milkie et al. (Volume 12, No. 2, pp. 85–86) teaches a high voltage stabilization circuit that may be used in applications for corona charging. The circuit employs a pair of zener diodes, working in conjunction with a pair of operational amplifiers to, among other things, create a dynamic error offset which is proportional to the desired high voltage potential and maintain the desired output with overload protection.

The present invention is a device for dynamically limiting the gain of a circuit employing an operational amplifier, a circuit which may have input signals which would normally over-drive the amplifier's output into a saturation condition. The advantage of the circuit is that the limiting capability dynamically reduces the gain such that the amplifier is never driven into saturation and, therefore, does not need to recover from what would otherwise be a saturation condition.

In accordance with the present invention, there is provided a dynamically limited amplifier including an operational amplifier having a pair of input terminals with an input potential therebetween, an output terminal, and a transistor element connected between one input terminal and an output terminal of the operational amplifier. The transistor element becomes operational and supplies a feedback current between the output terminal of the operational amplifier and the input terminal of the operational amplifier, whenever the output voltage of the operational amplifier exceeds a threshold potential to substantially prevent saturation of the operational amplifier.

In accordance with another aspect of the present invention, there is provided a null-seeking AC carrier feedback system, where the AC input signal passes through a zero potential. The AC carrier feedback system includes an operational amplifier, a feedback resistor connected between an inverting input of the operational amplifier and the output of the operational amplifier, and an input resistor connected between the AC input signal source and the inverting input of the operational amplifier. The AC carrier feedback system also includes a dynamic limiter which is connected between the inverting input and the output of the operational amplifier. The dynamic limiter includes an NMOS field-effect transistor having a drain connected to the inverting input of the operational amplifier, a source connected to the output of the operational amplifier, and a gate connected to a first reference potential, so that when the operational amplifier output potential is less than a negative threshold, determined as a function of the first reference potential, the NMOS field-effect transistor will operate in an enhancement mode to provide a feedback current to the input terminal of the operational amplifier. The dynamic limiter also includes a PMOS field-effect transistor having a drain connected to the inverting input of the operational amplifier, a source connected to the output of the operational amplifier, and a gate connected to a second reference potential, so that when the output terminal potential exceeds a positive threshold, determined as a function of the second reference potential, the PMOS field-effect transistor will operate in an enhancement mode to provide a feedback current to the input of the operational amplifier.

The present invention will be described in connection with a preferred embodiment. However, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
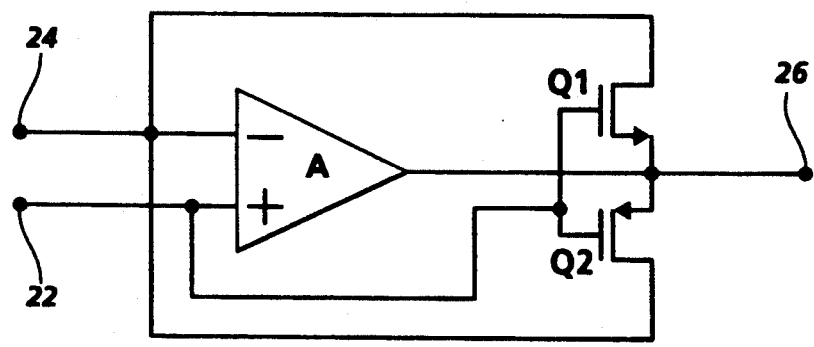
FIG. 1 is a simplified electrical schematic illustrating an embodiment of the present invention.

For a general understanding of the dynamic limiting characteristics of the present invention, reference is made to the drawings. In the drawings, like reference numerals have been used throughout to designate identical elements. FIG. 1 shows a basic electrical circuit that represents the dynamic limiter, 20. Included in dynamic limiter 20 are two field-effect transistors (FETs), $Q_1$ and $Q_2$, and an operational amplifier (opamp) A. In general, opamp A may be any commonly known opamp, although those that can be produced using a standard complementary metal-oxide semiconductor (CMOS) production process are particularly well suited for this application. The opamp has a non-inverting input terminal 22, an inverting input terminal 24, and an output terminal 26.

Both of the metal-oxide semiconductor (MOS) field-effect transistors $Q_1$ and $Q_2$, are also produced using the CMOS process and, ideally, would be produced upon the same substrate as operational amplifier A. $Q_1$ is an n-type MOS (NMOS) transistor, while $Q_2$ is a p-type MOS (PMOS) transistor. Both are enhancement mode devices and typically establish a conductive channel whenever the gate-source voltage ($V_{gs}$) exceeds a non-zero potential. In addition, the threshold potentials for both $Q_1$ and $Q_2$ are "matched" to approximately the same magnitude or level, $Q_1$ having a negative threshold potential and $Q_2$ a positive threshold potential. The matching is achieved by carefully controlling the dimensions of the various layers which make up the field-effect transistors in the CMOS process. By controlling the dimensions of the transistors and the threshold potential, the $V_{gs}$ potential at which the transistors become active, can be established at a potential which is less than the saturation point of the opamp. In one embodiment the threshold potential level is 1.0 volt, although threshold potentials in the range of about 0.6 volts to 1.2 volts are achievable. Thus, either the $Q_1$ or $Q_2$ field-effect transistor would provide a feedback loop whenever the voltage potential of the output of opamp A causes $V_{gs}$ of the respective transistor to exceed its threshold potential. Although the circuit is illustrated with the gates of both the $Q_1$ and $Q_2$ transistors connected to the non-inverting input of opamp A, in alternative embodiments the gates may be individually connected to other potentials to achieve different limiting characteristics for the circuit.

In another alternative embodiment, the $Q_1$ and $Q_2$ transistors may be replaced by n-p-n and p-n-p type transistors, respectively. In such an embodiment, the operation of the dynamic limiter would be similar to that previously described. However, the threshold voltages of the transistors is set by the forward drop of the base-emitter junction and, therefore, cannot be controlled as conveniently as the gate-source voltage of a MOS FET. Also, the finite base current generated by the collector current must be taken into account. Accordingly, the dynamic limiter threshold could be set at multiples of base-emitter drops by using Darlington connections, or it could be set by returning the bases to different reference potentials.

Figure 2:
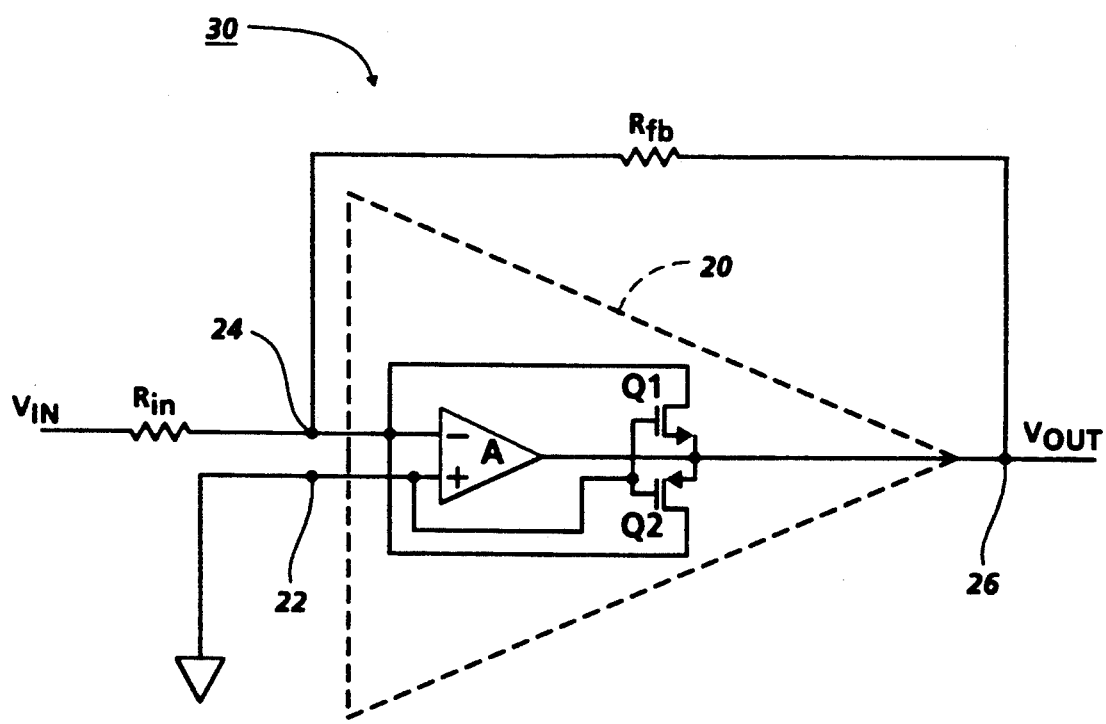
FIG. 2 is an electrical schematic showing an application of the dynamically limited amplifier of FIG. 1.

Referring now to FIG. 2, dynamic limiter 20 is represented as part of a null-seeking AC carrier feedback system 30, where an AC signal, $V_{in}$, is provided to input terminal 24 through input resistor $R_{in}$. In one embodiment, $V_{in}$ may be an AC signal which, when at null, has a zero voltage passed to the amplifier circuit of feedback system 30. For example, the dynamic limiter may be used in a non-contacting electrostatic voltmeter, to process the alternating signal produced by the modulation of the capacitive coupling relationship between a sensor and an electrostatic field, as described in the copending U.S. patent application for an "Electrostatic Voltmeter Employing High Voltage Integrated Circuit Devices," by Alan J. Werner Jr. et al., Ser. No. 07/878,658, which is hereby incorporated by reference for its teachings. Because the AC signal has a zero voltage passed to the amplifier circuit when at null, any nonlinearity in dynamic limiter 20 is unimportant, and it is the ability of the feedback system to recover from higher voltage potentials, which would saturate simple amplifier feedback systems, that is required. Also included in feedback system 30 is a feedback resistor, $R_{fb}$, providing a feedback path between the output of dynamic limiter 20 at output terminal 26, and the inverting input terminal 24, of the dynamic limiter.

Figure 3:
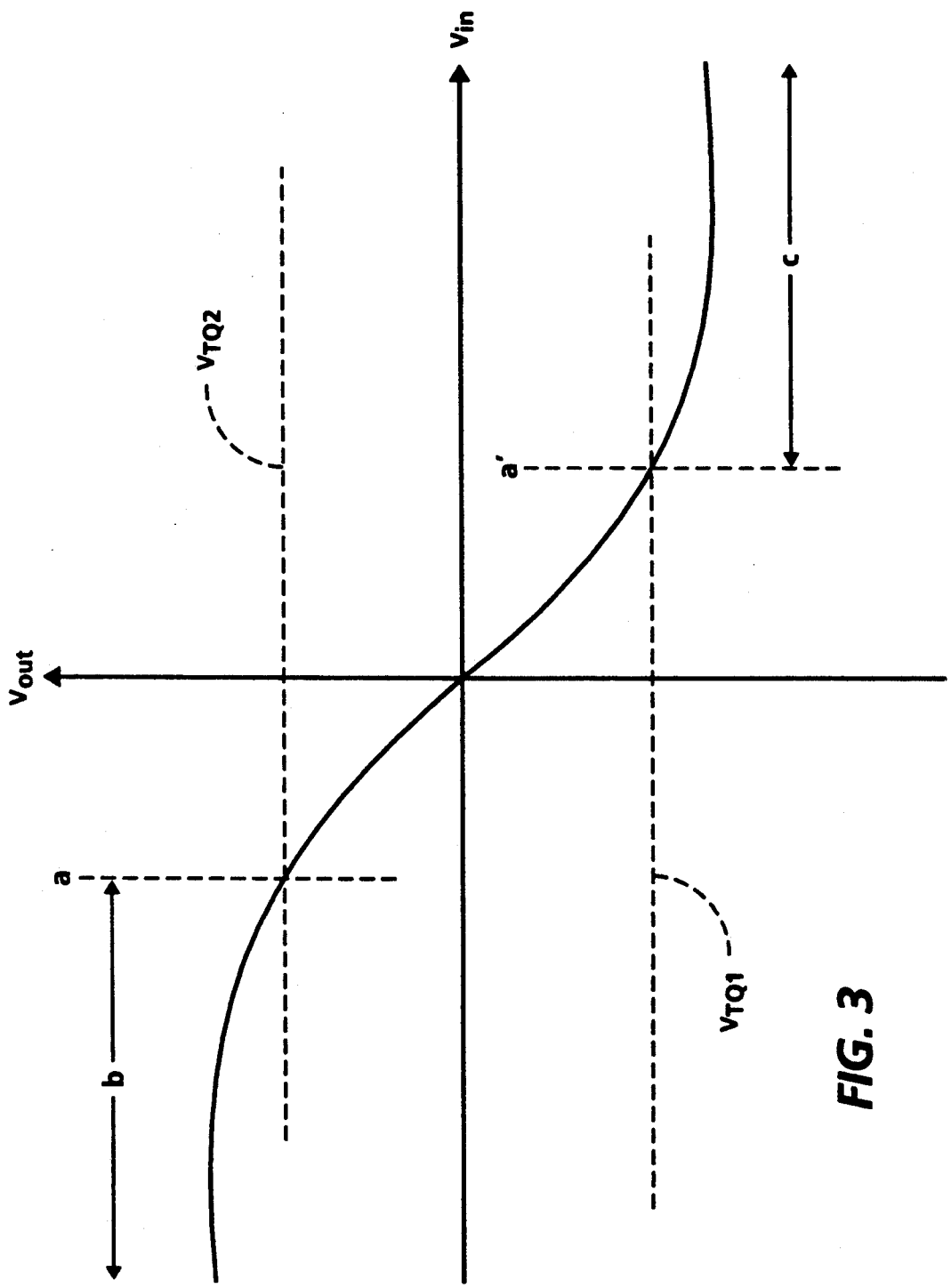
FIG. 3 is a representation of the voltage transfer characteristic for the present invention typical for the application illustrated in FIG. 2.

Referring also to FIG. 3, which shows the output characteristic of feedback system 30, the gain over the region a–a' is linear, typical of most amplifier feedback circuits, and is a function of the ratio of the resistances of feedback resistor $R_{fb}$ and input resistor $R_{in}$. Outside of the linear range, the gain of the system is a function of the saturation resistance of the MOS FET devices and the input resistor. More specifically, for input potentials greater than a', illustrated as region c, the gain is as follows:

$$G_{a'} = R_{Q1sat.}/R_{in},$$

where $R_{Q1sat.}$ is the resistance of the $Q_1$ device at the saturation potential. While for input potentials less than a, illustrated as region b, the gain is:

$$G_a = R_{Q2sat.}/R_{in},$$

where $R_{Q2sat.}$ is the resistance of the $Q_2$ device at the saturation potential. In contrast, the feedback loop of common opamp-feedback systems opens when the amplifier output is driven to its limit. Thus, all control of the gain and the inverting input is lost. The linear region from a–a', is defined by the threshold potentials of the PMOS ($Q_2$) and NMOS ($Q_1$) transistors, $V_{TQ2}$ and $V_{TQ1}$, respectively. In the present embodiment, the presence of controlled low gain, beyond the linear region, allows the system to gradually "cut-in" to the limiting range, thereby reducing the hysteretic effects commonly seen when the opamp is driven to saturation, where feedback control is lost and where input voltages are forced from their normal operating potentials. The "hard" cut-in effects more commonly found in limiting systems employing zener diodes is also avoided. Thus, the present invention allows the use of increasingly higher gains for small signal levels, gain being a function of the $R_{fb}$ and $R_{in}$ resistance values, without incurring any of the problems associated with output saturation of the amplifier.

In recapitulation, the present invention is a dynamic limiting amplifier suitable for use in analog circuits requiring high gain, where susceptibility to output saturation, and the associated loss of controlled feedback, is undesirable. The invention utilizes MOS FET or similar devices to produce the limiting effects with a commonly known operation amplifier. Moreover, the invention may be implemented on a common integrated circuit, resulting in a reduction of the number of components necessary to limit an opamp. The reduced component count and the ability to produce the devices using relatively inexpensive integrated circuit technology also reduces the overall cost of the limiting system.

It is therefore, apparent that there has been provided, in accordance with the present invention, an apparatus for dynamically limiting the feedback mode of an operational amplifier circuit. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. A dynamically limited amplifier, comprising:
   an operational amplifier having an inverting input terminal and a non-inverting input terminal with an input potential therebetween, and an output terminal having an output potential; and
   transistor means, connected between the inverting input terminal and the output terminal of the operational amplifier, for supplying a feedback current to the inverting input terminal as a function of the output potential, wherein said transistor means comprises a field-effect transistor including:
   a drain connected to the inverting input terminal of said operational amplifier
   a source connected to the output terminal of said operational amplifier, and
   a gate connected to a reference voltage, so that the field-effect transistor will operate in an enhancement mode to provide a feedback current to the inverting input terminal when the output terminal potential of said operational amplifier exceeds a non-zero threshold level, so that said transistor means substantially prevents the input saturation of the operation amplifier.

2. The dynamically limited amplifier of claim 1, wherein the threshold level is less than the saturation potential for the operational amplifier.

3. A dynamically limited amplifier, including:
   an operational amplifier having a pair of input terminals with an input potential therebetween, and an output terminal having an output potential; and
   transistor means, connected between a first input terminal of the operational amplifier and the output terminal of the operational amplifier, for supplying a feedback current to the first input terminal as a function of the output potential, said transistor means becoming operational whenever the output potential of the operational amplifier exceeds a threshold level, to substantially prevent input saturation of the operational amplifier, and wherein the transistor means comprises:
   an NMOS field-effect transistor having a drain connected to the inverting input terminal of the operational amplifier and a source connected to the output terminal of the operational amplifier, said NMOS field-effect transistor having a gate connected to a reference potential, so that if the output potential is less than a negative threshold level, the NMOS field-effect transistor will operate in an enhancement mode to provide a feedback current to the inverting input terminal of the operational amplifier; and
   a PMOS field-effect transistor having a drain connected to the inverting input terminal of the operation amplifier and a source connected to the output terminal of the operational amplifier, said PMOS field-effect transistor having a gate connected to the reference potential, so that if the output potential exceeds a positive threshold level, the PMOS field-effect transistor will operate in an enhancement mode to provide a feedback current to the inverting input terminal of the operational amplifier.

4. The dynamically limited amplifier of claim 3, wherein the operational amplifier, the NMOS field-effect transistor, and the PMOS field-effect transistor are contained within a common integrated circuit.

5. The dynamically limited amplifier of claim 4, wherein the integrated circuits is comprised of metal, oxide and semiconductor materials and where the magnitudes of the positive and negative threshold potentials are adjusted to match by controlling the dimensions of the PMOS and NMOS field-effect transistors, respectively.

6. A null-seeking AC carrier feedback system where the AC input signal passes through a zero potential, comprising:
   an operational amplifier having an inverting input terminal, a non-inverting input terminal, and an output terminal;
   a feedback resistor, connected between the inverting input terminal and the output terminal of the operational amplifier;
   an input resistor, connected between a source of the AC input signal and the inverting input terminal of the operational amplifier; and
   a dynamic limiter connected between the inverting input terminal and the output terminal of the operational amplifier, said dynamic limiter comprising, an NMOS field-effect transistor having a drain connected to the inverting input terminal of the operational amplifier, a source connected to the output terminal of the operational amplifier, and a gate connected to a first reference potential, so that when the output terminal potential is less than a negative threshold, said negative threshold determined as a function of the first reference potential, the NMOS field-effect transistor will operate in an enhancement mode to provide a feedback current to the inverting input terminal of the operational amplifier, and a PMOS field-effect transistor having a drain connected to the inverting input terminal of the operational amplifier, a source connected to the output terminal of the operational amplifier, and a gate connected to a second reference potential, so that when the output terminal potential exceeds a positive threshold, said positive threshold determined as a function of the second reference potential, the PMOS field-effect transistor will operate in an enhancement mode to provide a feedback current to the inverting input terminal of the operational amplifier.

7. The null-seeking AC carrier feedback system of claim 6, wherein the gates of the PMOS and NMOS field-effect transistors are connected to the non-inverting input of the operational amplifier.

8. The null-seeking AC carrier feedback system of claim 6, wherein the system has a linear gain for an output potential between a first level, equal to the sum of the PMOS field-effect transistor gate potential plus the PMOS field-effect transistor positive threshold potential, and a second level, equal to the sum of the NMOS field-effect transistor gate potential plus the NMOS field-effect transistor negative threshold potential.

9. The null-seeking AC carrier feedback system of claim 8, wherein the system has a nonlinear gain when the output potential is greater than the first level, said nonlinear gain being a function of the internal resistance of the PMOS field-effect transistor and the resistance of the input resistor.

10. The null-seeking AC carrier feedback system of claim 9, wherein the system has a nonlinear gain when the output potential is less than the second level, aid nonlinear gain being a function of the internal resistance of the NMOS field-effect transistor and the resistance of the input resistor.

11. The null-seeking AC carrier feedback system of claim 6, wherein the operational amplifier, the NMOS field-effect transistor, and the PMOS field-effect transistor are contained within a common integrated circuit.

12. The dynamically limited amplifier of claim 1, wherein the reference potential is the potential applied to the non-inverting input of the operational amplifier.

13. The dynamically limited amplifier of claim 12, wherein the threshold level is maintained at a constant offset from the reference potential and thereby varies as a function of the reference potential.

* * * * *